United States Patent [19]

Caudel

[11] 4,014,012
[45] Mar. 22, 1977

[54] SEGMENT SCANNING METHOD FOR CALCULATOR DISPLAY SYSTEM

[75] Inventor: Edward R. Caudel, Houston, Tex.

[73] Assignee: Texas Instruments Incorporated, Dallas, Tex.

[22] Filed: Apr. 7, 1975

[21] Appl. No.: 565,489

[52] U.S. Cl. .......................... 340/336; 340/166 EL; 340/324 M

[51] Int. Cl.² .......................................... G09F 9/32

[58] Field of Search ............. 340/324 M, 336, 337; 178/30

[56] References Cited
UNITED STATES PATENTS

3,911,424  10/1975  Giannuzzi et al. ................ 340/336
3,918,041  11/1975  Mao ................................. 340/336

Primary Examiner—Marshall M. Curtis
Attorney, Agent, or Firm—Harold Levine; Rene' E. Grossman; John G. Graham

[57] ABSTRACT

A method for displaying characters using a segment scanning technique, as for an electronic calculator of the type employing segmented visible light emitting diodes. The segments are scanned in a regular sequence while the digits are selectively actuated in a code corresponding to the data to be displayed. A representation of each segment to be displayed is compared with each of the digits in a data memory, and a display signal is generated if the digit contains each segment. These display signals are used to control the selective actuation of the digits.

9 Claims, 10 Drawing Figures

PRIOR ART

SEGMENT SCANNING METHOD FOR CALCULATOR DISPLAY SYSTEM

BACKGROUND OF THE INVENTION

The invention relates to calculator or digital data processing systems, and particularly to a technique for displaying data in such systems.

Electronic calculator systems of the type having all of the main electronic functions within a single large scale integrated (LSI) semiconductor chip, or a small number of chips, are described in the following prior applications or patents assigned to Texas Instruments Incorporated: U.S. Pat. No. 3,819,921, by Kilby et al., for "Miniature Electronic Calculator", based on an application originally filed Sept. 29, 1967; Ser. No. 163,565, filed July 19, 1971, by Boone and Cochran, for "Variable Function Programmed Calculator" (now Ser. No. 420,999, filed Dec. 3, 1973); Ser. No. 400,473, filed Sept. 24, 1973, by Bryant for "Digit Mask Logic In Electronic Calculator Chip"; Ser. No. 400,437, filed Sept. 24, 1973, by Vandierendonck, Fisher and Hartsell for "Electronic Calculator With Display And Keyboard Scanning"; Ser. No. 397,060, filed Sept. 13, 1973, by Cochran and Grant, for "Multi-Chip Calculator System"; Ser. No. 525,236, filed Nov. 19, 1974, by Raymond and Caudel, for "Electronic Calculator or Digital Processor Chip With Multiple Code Combinations of Display And Keyboard Scan Outputs"; and others.

These prior inventions have made possible vast reductions in cost and size, and increases in functions, in electronic calculators. Many millions of such calculators have been produced. The efforts to reduce manufacturing costs and increase the functions available to the user are continuing. Particularly, it is desirable to provide a basic chip structure that is quite versatile and can be used for many different types of calculators and similar digital processing equipment. This permits a single manufacturing facility to produce large quantities of the same devices, differing only in a single mask change, to produce dozens of different variations, while still maintaining large volume cost advantages.

Although the MOS/LSI calculator system as referred to above incorporated on one or two chips all of the computational circuits of the calculator, including data registers, arithmetic unit, a ROM for containing the program, and all of the control circuits, input/output decoders, and the like, it was still necessary to have certain external devices on a printed circuit board to provide a completed calculator. That is, the MOS/LSI package, along with a display and a keyboard, did not alone provide a calculator. Initially, hand-held, battery operated "one-chip" calculators required, in addition to the MOS/LSI chip, several external circuits for power supply, clock generators, and digit and segment drivers. Subsequent developments have made it possible to eliminate the external clock generator circuits by placing these on the chip itself. By using improved MOS processes, it is possible to eliminate or minimize the external power supply circuitry; if the MOS logic will be operated at low voltage, then it can be driven directly from batteries. The digit and segment drivers have heretofore been necessary, however, because the electrical specifications for drive voltage and current have been such that MOS/LSI components were not suited to drive LED's directly.

It is the primary object of this invention to provide a calculator system or the like wherein no components external to an MOS/LSI chip are needed, other than a display and a keyboard. Another object is to provide improved display drive circuitry for an electronic calculator or the like. Another object is to provide a more versatile output multiplexing arrangement for a calculator or digital processor. A further object is to provide an improved technique for display and keyboard scanning in a calculator or the like.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

The Overall System

Figure 1:
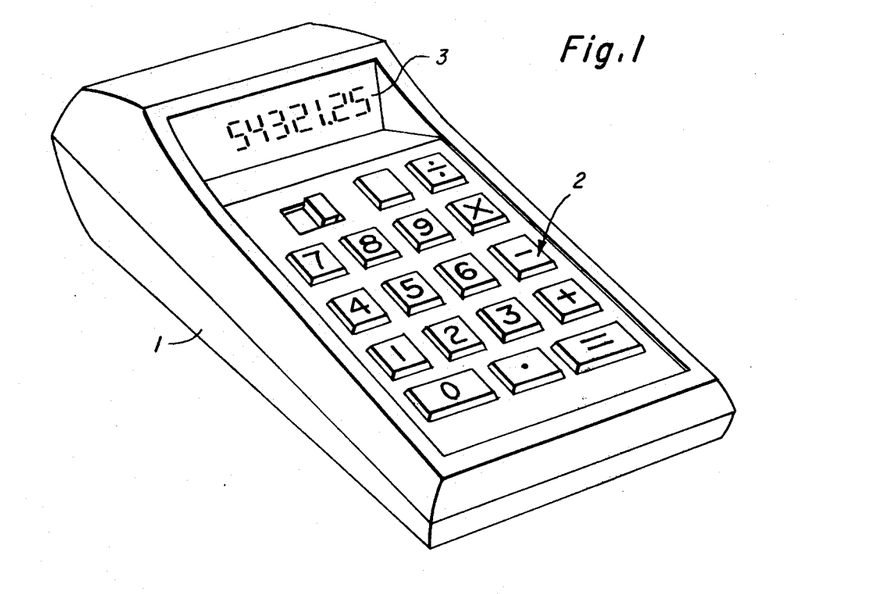
FIG. 1 is a pictorial view of a small hand-held calculator in which the system of the invention may be utilized.

Referring to FIG. 1, a typical small electronic calculator in which the invention finds utility is shown, comprising a housing 1 of molded plastic or the like, with a keyboard 2 and a display 3. The keyboard includes number keys 0-9, a decimal point key, and several standard operation keys such as +, −, =, ×, ÷, C (clear), etc. In other embodiments, the calculator system could perform a variety of additional functions, so keys such as $\sqrt{x}$, $^x\sqrt{y}$, $Y^x$, SIN, COS, TAN, LOG, etc., may be included in the keyboard 2. For simplicity of explanation, the display 3 is shown as having six digits of the seven segment type, with provision for decimal point although it is understood that displays of eight, 10 or 12 digits are standard and these may include exponents or scientific notation, and minus sign for both mantissa and exponent. The display usually comprises light emitting diodes (LED's), although a gas discharge panel, or liquid crystal devices, for example, may also be used. The calculator is a self-contained unit having a power supply in the form of a battery or batteries within the housing 1, although an AC adapter may be attached, as well as a battery charger.

Display and Keyboard Scanning in the Prior Art

Figure 1A:
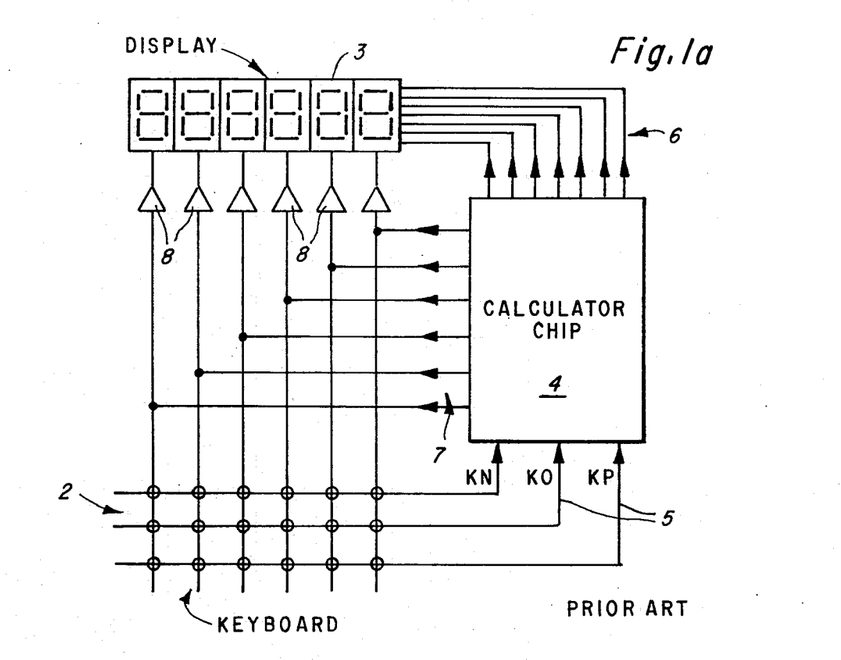
FIG. 1a is a block diagram of a prior art display and keyboard scanning system which is typically used in a calculator as that of FIG. 1.
Figure 1B:
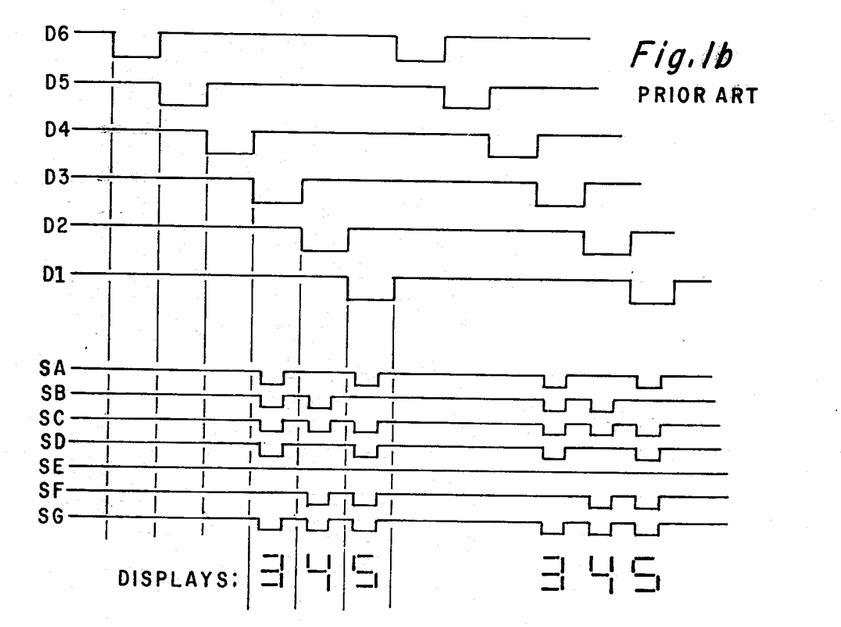
FIG. 1b is a timing diagram in the form of a graph of voltage vs time for the prior art system of FIG. 2.
Figure 1C:
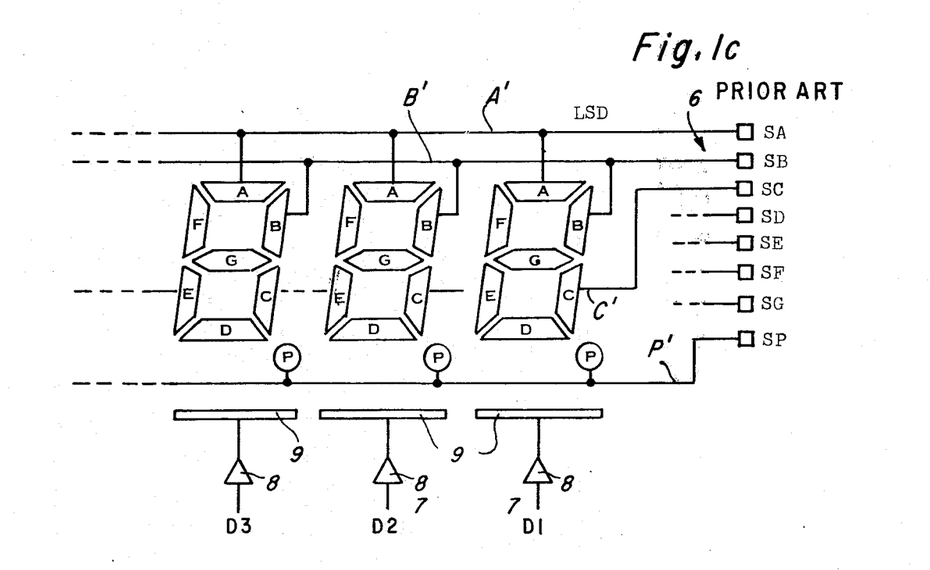
FIG. 1c is an electrical diagram of the display used in the calculator of FIG. 1.

Essentially all of the electronic circuits of a calculator as in FIG. 1 are contained within a large-scale-integrated semiconductor chip which is typically packaged in a twenty-eight pin plastic package and mounted on a printed circuit board within the housing 1. The general organization of a prior art calculator system is seen in block diagram in FIG. 1a, where the keyboard 2 and display 3 are interconnected with the semiconductor chip 4 employing display multiplexing and keyboard scanning in the manner set forth in said application Ser. No. 420,999. Inputs to the chip are by three "K lines" 5 which are designated KN, KO, KP. Outputs from the chip include eight segment outputs SA to SP on lines 6 which are connected to common segments of the display 3. Typically, the segments are anodes of LED's. All like segments in each of the digits of the display are connected together as seen in FIG. 1c, so only eight segment outputs are needed. The digits or cathodes of the display 3 are driven by putput lines 7 which are labelled D1 to D6, with digit drivers 8 being used to provide suitable voltage and current levels for the particular display. The lines D1 to D6 are also connected to the matrix of key switches which make up the keyboard 2. With six output lines D1 to D6, the matrix contains six times three or eighteen crosspoints so there are eighteen possible key positions, not all of which need be used. A minimum function calculator with only a [X], [÷], [+], [−], [=], [C], [.], [0—9] keyboard needs only seventeen keys so seventeen of the crosspoints are used. Other input/output pins for the chip 4 include a voltage supply or Vdd pin, a ground or Vss pin, and an oscillator input or control φ for the on-chip oscillator.

A standard twenty-eight pin integrated circuit package may be employed for a calculator having up to a twelve digit display when time multiplexing of the keyboard and display input/output is used in the manner set forth in application Ser. No. 420,999. To this end, the digit lines D1 to D6 of FIG. 1a are driven with sequential pulses as seen in FIG. 1b. The pulses would occur in the order of D6, D5, D4, D3, D2, D1, i.e., MSD to LSD, so that leading zero suppression may be implemented. The same pulses D6 to D1 are used to drive the vertical lines of the keyboard matrix 2, so the inputs KN, KO, KP to the chip 4 are time-encoded. The segment outputs occur one digit at a time, in synchronization with the digit pulses D6 to D1, and these outputs are coded so that the proper segments light up for the desired digit to be displayed in each position. To display the "345", the segments shown in FIG. 1b would be energized during D3, D2 and D1 as illustrated. During D6, D5 and D4, no segment pulses would occur due to leading zero suppression.

Referring to FIG. 1c, the display 2 is shown in more detail. Three of the six digits are shown. Each digit is made up of seven segments A to G plus a decimal point P. The outputs 6 from the chip are labeled SA to SP corresponding to the segments in the display. All of the A segments are connected together by a line A', all B's are connected together by a line B', all C's by a line C', etc., and all decimal points P are connected together by a line P'. The segments A to P represent separate anodes sharing a common cathode in a LED unit. The digit outputs D1 to D6 are separately connected to cathodes 9. Cathodes are common to all anode segments in a digit for LED displays. Digit drivers 8 couple the D lines 7 to the anodes 9; these are amplifiers to provide the proper voltage and current levels for actuating the display elements. All of the drivers 8 are usually contained in a pair of bipolar integrated circuit packages.

Figure 1D:
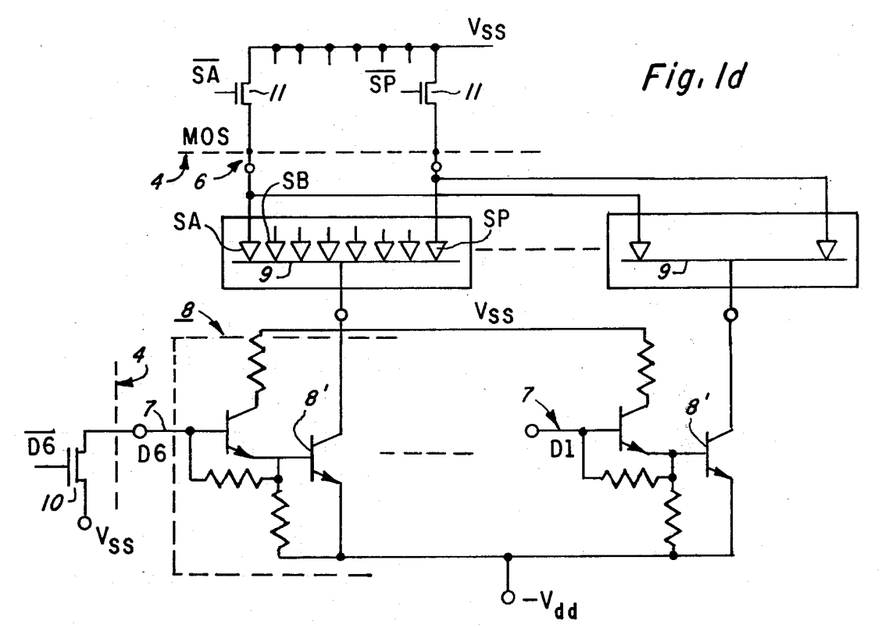
FIG. 1d is a schematic diagram of the display circuit of FIG. 1e.

The display arrangement of FIG. 1c of the prior art may be illustrated in electrical schematic diagram form as seen in FIG. 1d. Each digit of the display 3 is comprised of an LED with a common cathode 9 and eight separate segments A to P. The cathodes are each connected through a digit driver 8 consisting of an NPN transistor 8' which has its emitter connected to −Vdd. The D6–D1 outputs 7 are coupled to the bases of the transistors 8', usually through driver transistors with suitable biasing resistors. All of these components including transistors 8' and driver and biasing resistors are within an integrated circuit package. This invention makes possible the elimination of these components.

The outputs from the chip 4 on the lines 7 are by p-channel MOS output buffers 10 which are within the chip 4. The characteristics of p-channel MOS devices are such that considerably more current can be conducted to Vss than to Vdd, and so MOS/LSI chips have been heretofore preferably manufactured in a manner such that both digit outputs 7 and segment outputs 6 are "Vss" signals, i.e., they are shunted to Vss when "on" and open-circuited when "off". Thus, the segment outputs 6 in FIG. 1d are also connected internal to the chip 4 via p-channel MOS output buffers 11 to Vss. It is seen that a segment in one of the LED's, when selected for actuation, will be in a conductive path from Vss through an MOS transistor 11, a line 6, an anode A-P, a cathode 9, a transistor 8', to the −Vdd line. At this time, for the selected digit of the display 3, one of the transistors 10 within the chip 4 will be conducting to Vss so the associated transistor 8' will be biased to be conductive.

Figure 1E:
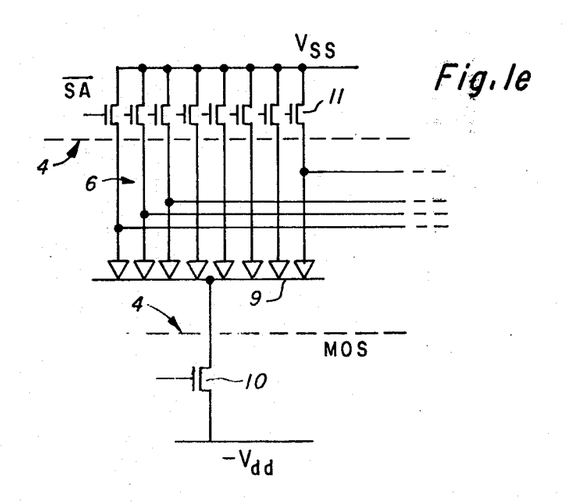
FIG. 1e is a schematic diagram of the desired modification of the circuit of FIG. 1d.

It has been long recognized that it would be desirable to eliminate the digit drivers 8, as this would significantly reduce the parts cost and assembly cost of a calculator. This could be done, theoretically, by connecting the MOS output buffer transistor 10 to −Vdd within the chip 4 as seen in FIG. 1e, instead of to Vss as in FIG. 1d. The problem with this is that the digit output buffer 10 potentially conducts eight times as much current as the segment output buffer 11 in the MOS chip, whereas the segment output buffers 11 are much more capable of sinking current since they are connected to Vss, as compared to the digit output buffers 10 which are connected to −Vdd. This is due to the inherent characteristics of p-channel MOS/LSI devices. It is for this reason that this invention is of great value.

Segment Scan System

Figure 2:
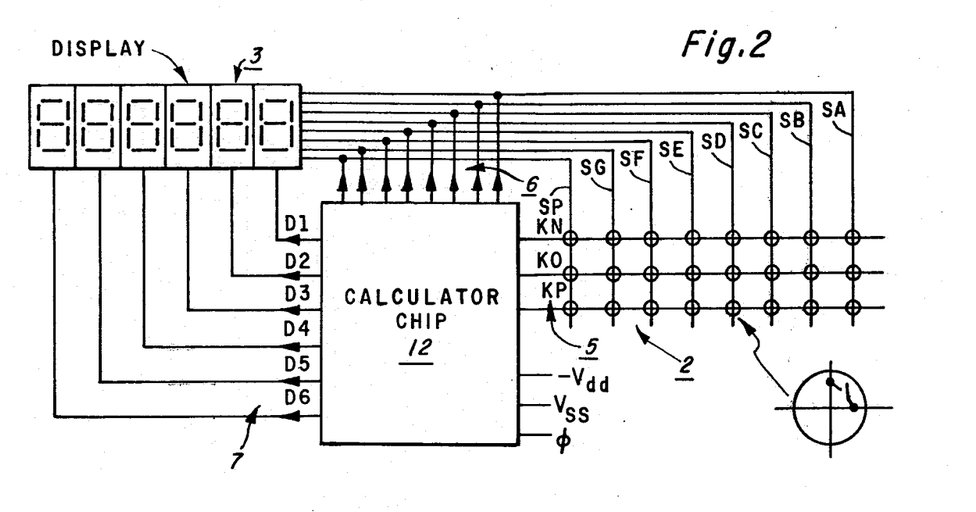
FIG. 2 is a block diagram of a display and keyboard scanning system for a calculator according to the invention.
Figure 2A:
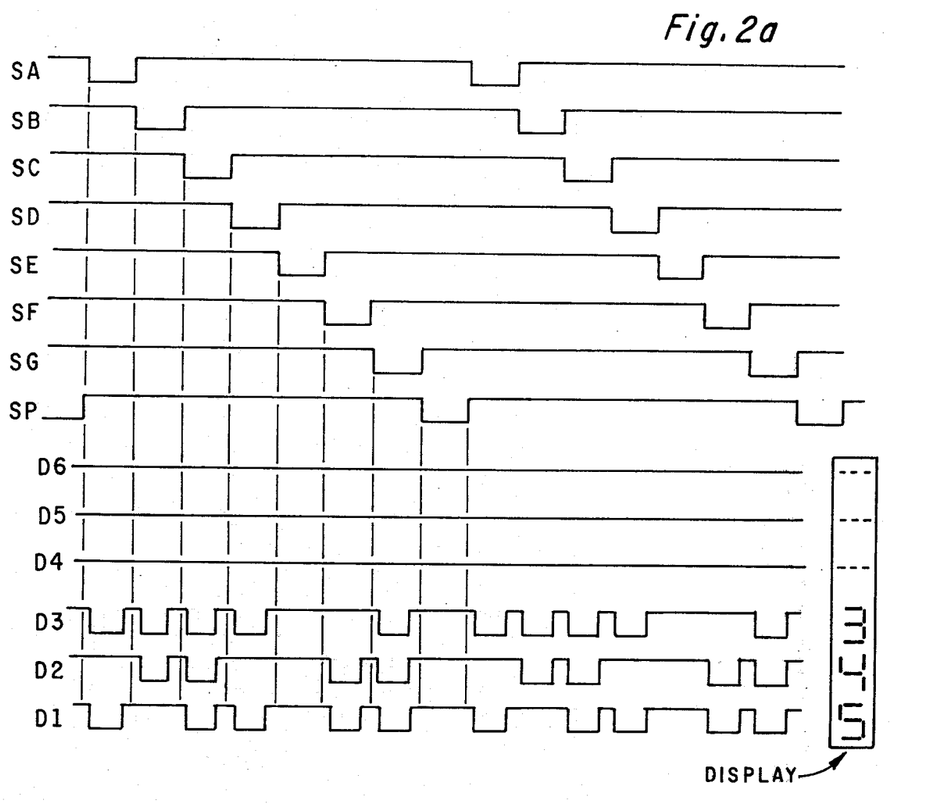
FIG. 2a is a timing diagram in the form of a graph of voltage vs time in the system of FIG. 2.

Referring now to FIG. 2, a calculator system is shown wherein the keyboard 2 and display 3, of the same type as in FIG. 1a, are interconnected with a semiconductor chip 12 which employs segment scanning according to the invention. As before, inputs to the chip are by three "K" lines 5 designated KN, KO, KP. Outputs from the chip 12 include eight segment outputs SA to SP on lines 6 which are connected to the common anode segments of the LED display 3, all like segments being connected together as in FIG. 1c. Differing from previous systems, however, the segment outputs 6 are scanned or strobed in a regular repeating sequence of signals SA to SP as seen in FIG. 2, in a manner similar to the digit scanning of FIGS. 1a and 1b. The digits or cathodes of the LED's of the display 3 are selectively energized by output lines 7 labeled D1 to D6 in a coded manner synchronized with the segment scan signals SA to SP so that the desired digits will be visible, such as illustrated in the example of FIG. 2a. To show the decimal number 000345, or - - - 345 with leading zeros suppressed, only D1, D2 and D3 signals will appear, and only in the code shown. For example, when SA is actuated, D3 and D1 will be actuated because the A segment appears in the "3" and "5" of digit positions three and one, respectively, but not in the "4" of digit position two.

The segment scan lines 6 are also connected to the matrix of key switches which make up the keyboard 2, so that the keyboard functions in the same manner as in FIG. 1. As before, the chip 12 includes a voltage supply −Vdd pin, a ground or Vss pin, and an oscillator input or clock control pin $\phi$ for the on-chip oscillator.

The System Block Diagram

Figure 3:
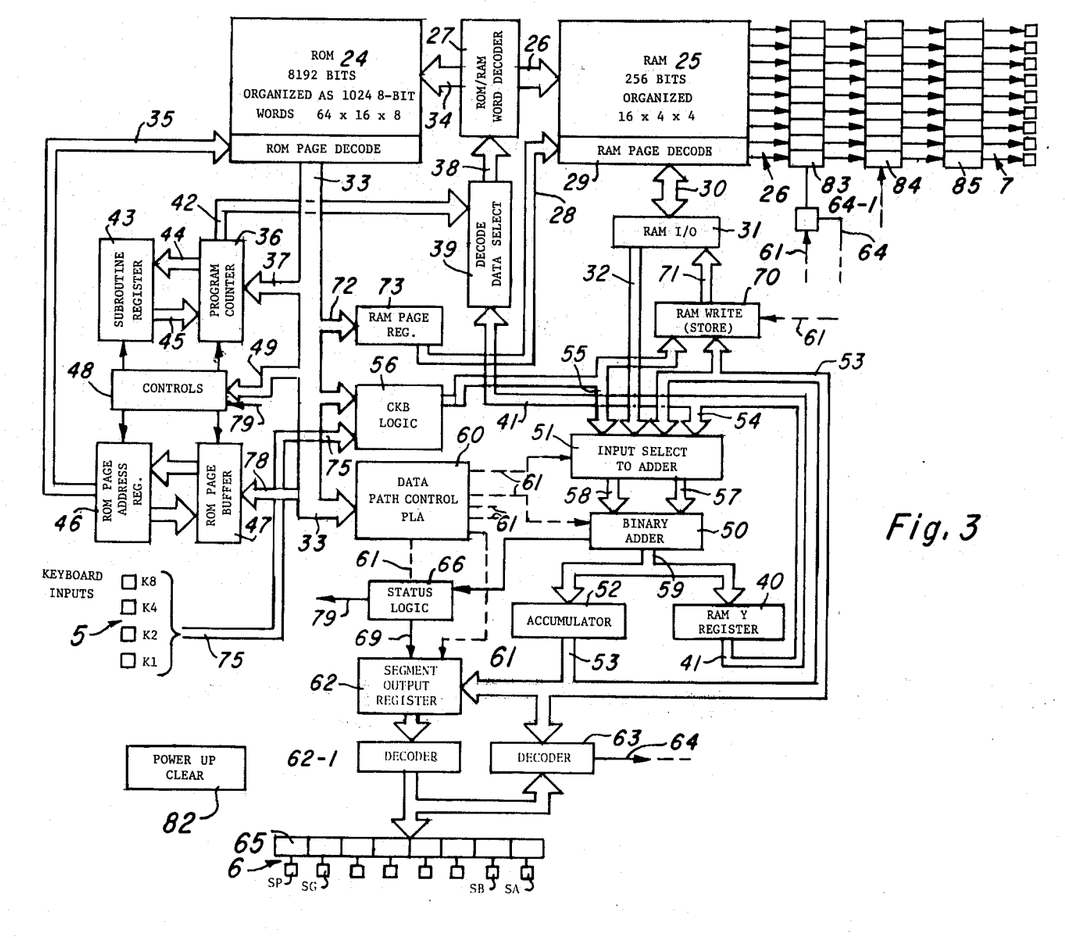
FIG. 3 is a detailed block diagram of one electronic system which may incorporate the principles of the invention, in particular the chip 12 of FIG. 2.

A block diagram of the system of the chip 12, suitable for implementing the invention, is shown in FIG. 3. This system is basically the same as the digit processor chip described in copending application Ser. No. 525,236, with changes in the digit and segment outputs as will be apparent. The system is centered around a ROM (read-only-memory) 24 and a RAM (random-access-memory) 25. The ROM 24 contains a large number, for example 1024, instruction words of eight bits per word, and is used to store the program which operates the system. The RAM 25 contains 256 memory cells software organized as four sixteen-digit groups with four bits per digit. Numerical data entered by the keyboard is stored in the RAM 25, along with intermediate and final results of calculations, as well as status information or "flags", decimal point position and other working data. The RAM functions as the working registers of the calculator system, although it is not organized in a hardware sense as separate registers as would be true if shift registers or the like were used for this purpose. The RAM is addressed by a word address on lines 26, i.e., one out of sixteen word lines in the RAM is selected, by means of a combined ROM and RAM word address decode circuit 27. One of four "pages" of the RAM is selected by an address signal on two lines 28 applied to a RAM page address decoder 29 in the RAM. For a given word address on lines 26 and page address on lines 28, four specific bits are accessed and read out on RAM I/O lines 30, via input/output circuit 31, to RAM read lines 32. Alternatively, data is written into the RAM 25 via the input/output circuitry 31 and the lines 30. Some of the sixteen lines 26 used as RAM word address are also used to generate the digit signals for display actuation on the lines 7; to this end the lines 26 pass through the RAM 25 and are connected to output registers and buffers as will be explained.

The ROM 24 produces an eight bit instruction word on ROM output lines 33 (the bits of the instruction word being labeled R0-R7) during each instruction cycle. The instruction is selected from 8192 bit locations in the ROM, organized into 1024 words containing eight bits each. The words are divided into 16 groups or pages of 64 words each. To address an instruction in the ROM requires a one-of-sixty-four ROM word address on lines 34 and a one-of-sixteen ROM page address on lines 35. The ROM word address on lines 34 is generated in the same decode 27 as used to generate the RAM word address on lines 26. The ROM word address is a six-bit address produced in a program counter 36 which is a six-stage shift register that may be updated after an instruction cycle or may have a six-bit address loaded into it via lines 37 from ROM output lines 33 for a call or branch operation. The RAM and ROM word address decoder 27 receives a six-bit encoded address on lines 38 from decode data select unit 39 which has two inputs. The unit 39 may receive a four-bit address from RAM Y register 40 via lines 41, or it may receive a six-bit address from the program counter 36 via lines 42. A six-bit subroutine register 43 is associated with the program counter 36 to serve as temporary storage for the return word address during subroutine operations. A six-bit address is stored in the register 43, via lines 44 when a call instruction is initiated so that this same address may be loaded back into the program counter 36 via lines 45 when execution of the subroutine which begins at the call location has been completed; this conserves instruction words and makes programming more flexible. The ROM page address on lines 35 is generated in a page address register 46 which also has a buffer register 47 associated with it for subroutine purposes. The register 46 will always contain the current page address for the ROM, and directly accesses the ROM page decoder. The buffer register 47 is a multifunction buffer and temporary storage register, the contents of which can be the present ROM page address, an alternate ROM page address, or the return page address during subroutine operations. The program counter, subroutine register and ROM page addressing are all controlled by control circuitry 48 which receives inputs from the ROM output lines 33 via lines 49. The control circuitry 48 determines whether branch and call on "status" or subroutine operations are performed, causes loading of an instruction word into the program counter and/or page address register, controls transfer of bits to the subroutine or buffer registers and back, controls updating of the program counter, etc.

Numerical data and other information is operated upon in the system by a binary adder 50 which is a bit-parallel adder having a precharged carry circuit, operating in binary with software BCD correction. The input to the adder 50 is determined by an input selector 51 which receives four-bit parallel inputs from several sources and selects from these what inputs are applied to the adder. First, the memory read or recall lines 32 from the RAM 25 provide one of the alternatives. Two registers receive the adder output, these being the "RAM Y" register 40 and an accumulator 52, and each of these has output lines separately connected as inputs 53 and 54 of the selector 51. A fourth input 55 receives an output from "CKB" logic 56. Thus, the adder input is selected form the following sources: data memory or RAM 25 on lines 32; accumulator 52 via lines 53; RAM Y register 40 via lines 54; constant, keyboard or "bit" information from CKB logic 56 on lines 55. Positive and negative inputs to the adder 50 on lines 57 and 58 are produced from the selector circuitry 51.

The output from the adder 50 is applied to either or both the RAM Y register 40 and the accumulator 52 via lines 59. All of the operations of the adder 50 and its input selector 51, etc., are controlled by a data path control PLA 60 which is responsive to the instruction word on lines 33 from the ROM. Control outputs 61 from the control PLA 60 are indicated by dotted lines. The four-bit output from the accumulator 52 is unconditionally applied via lines 53 to a segment output arrangement which includes a three bit buffer register 62 and also includes a segment decoder 62-1 for output from the system. The register 62 defines which of the eight lines 6 are energized at a given time. It requires only three bits, so it uses only three of the four parallel outputs of the accumulator. A line 61 from the control PLA 60 applies a "load segment" command to the register 62 when programmed to do so, at which time the desired segment is loaded from the accumulator, and it will remain in the register 62 until zeros are loaded to clear the register. The decoder 62-1 is a standard decoder which accepts the three bit output of the register 62 and actuates one-of-eight of the lines 6, i.e., actuating one of the segment outputs SA to SP, via output buffers 65. A decoder 63, similar to a programmable logic array, also receives the four-bit output 53 from the accumulator 52, as well as the output of the decoder 62-1. After the register 62 has been set up, the digits to be displayed are outputted, one at a time, from the accumulator, and the decoder 63 detects when the digit to be displayed contains a segment which should be actuated. When this is true, a "display digit" command is produced on a line 64, which is used to control a digit output as will be described.

A status logic circuit 66 provides the function of examining for carry or compare from the adder 50, and determining whether to branch or call. To this end, inputs from the adder 50 via lines 67, and input from the control PLA 60 via lines 61 are provided.

A control circuit 70 determines what and when data is written into or stored in the RAM 25 via input/output control 31 and lines 30. This RAM write control 70 receives inputs from either the accumulator 52 via lines 53 or the CKB logic 56 via lines 55, and this circuit produces an output on lines 71 which go to the RAM I/O circuit 31. Selection of what is written into the RAM is made by the instruction word on lines 33, via the data path control PLA 60 and command lines 61. A feature of the system is that constants or keyboard information, from CKB logic 56, as well as the adder output via the accumulator, may be written into the RAM, via the write control 70, and further the CKB logic 56 can be used to control the setting and resetting of bits in the RAM, via the write control 70.

The RAM page address into which data is written is determined by two bits of the instruction word on lines 33, as applied via lines 72 to a RAM page address register 73 and thus to lines 28 which select the RAM page. The RAM word or Y address is of course selected by the contents of RAM Y register 40, select circuit 39 and decoder 27.

The keyboard inputs 5 appear on lines 75, from which an input to the CKB logic 56 is provided. Four inputs are shown, although the system of FIG. 2 needs only three. In normal operation, a keyboard input goes via CKB logic 56 to the accumulator 52 or RAM Y register 40, from whence it is processed by software or ROM programming.

Also included within the chip 12 is a clock oscillator and generator 80 which generates internally a basic clock frequency of about 500 KHz or less, and from this produces five clocks $\phi 1$ to $\phi 5$ used throughout the system. A power-up-clear circuit 82 produces controls which clear the calculator when the power is turned on.

The outputs 7 from the chip 12, used for display digit selection, are generated from the RAM word address on lines 26 by first digit output register 83 which is loaded under control of a command on a line 61, a command on a line 64 from the decoder 63, and by RAM word lines 26. That is, the digit to be displayed is transferred from its place in the RAM 25 via adder 50 to accumulator 52 and to decoder 63; if this digit contains the segment then actuated at the output of decoder 62-1, the decoder 63 produces an output on line 64, which will allow a "set command" to pass through a gate 64-1 from a line 61, so that whatever appears on the lines 26 will be loaded into register 83. The lines 26 are actuated in sequence, corresponding to the positions being outputted via 53 to decoder 63. After all nine digits have been examined, the register 83 will be set with all the digits to be actuated for the current segment. For the example of FIG. 2a, while SA is actuated, the stages D1 and D3 would be set to contain 1's and all other stages would be at 0 to display 345. The output from the first register 83 is connected to a second digit output register 84 which is loaded from the register 83 by a "load command" on a line 61 from the control PLA 60. The output of the register 84 is connected to a set of output buffers 85.

Sixteen outputs are possible, but only nine are provided as outputs in this example calculator design; eight digits are for mantissa, and one for minus sign. In this embodiment, nine stages are provided in the register 83, so only the first nine of the sixteen address lines 26 are used.

It is important that the register 83 is a random access register, where all bits are separately, independently, and mutually exclusively addressed. When one of the nine bits in the register 83 is addressed from decoder 27, either a "1" or "0" may be entered into register 83 under control of the "set command" on a line 61 from the control PLA, i.e., from the current instruction word, as determined by the output of the decoder 63 in the segment output arrangement. The bit will remain in the defined state until again specifically addressed and changed; meanwhile any or all of the other bits may be addressed and set or reset in any order. It is possible to have any combination of D register 83 bits set or reset, providing $2^9$ or 512 code combinations on the output lines 18. Ordinarily, however, a routine is used whereby the nine stages of the register 83 are addressed in decending order, MSD to LSD, repetitively, to provide a scan cycle. After a scan cycle, or during power up or hardware clear, all the bits of the register 83 are unconditionally set to "0" except the LSD which shows a zero to indicate that power is on.

Similar to the register 83, the other output register 62 is static in that the contents once entered will remain until intentionally altered. The output register 62 functions as an output buffer, remaining set while the accumulator 52 is being manipulated to form the next output or to output the digits to the decoder 63. The output register 83 is a similar buffer for outputting the contents of the Y register 40, but has the additional feature of being fully random access. The data sources for the Y register 40 are the following: a four-bit constant stored in the ROM 24 as part of an instruction word; the accumulator 52 transferred to the Y register 40 via the selector 51 and adder 50; and data directly from the RAM 25. Once data is in the Y register 40 it can be manipulated by additional instructions such as increment or decrement.

Figure 2B:
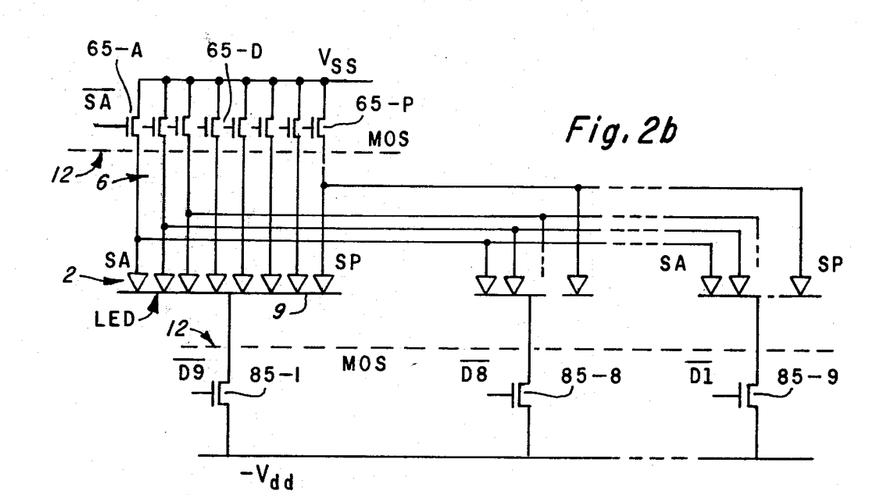
FIG. 2b is a schematic diagram of the display circuit for the system of FIG. 2.

Referring now to FIG. 2b, the display circuit using the system of FIGS. 2 and 3 is illustrated. The segment output buffers 65 include eight p-channel MOS transistors 65-A to 65-P, each of which has its source-drain path connected between Vss and one of the lines 6. The cathode 9 of each digit is connected via a line 7 to one of the nine digit output buffers 85, each of which includes one of the p-channel MOS transistors 85-1 to 85-9 which have their source-drain paths connected between the cathodes 9 and the −Vdd voltage supply. The advantage of this arrangement is that at any given instant a digit output buffer transistor can be conducting the current of only one segment, rather than up to eight segments as is true in the system of FIGS. 1 to 1c. The current of one segment can be sinked to −Vdd, whereas the current of eight segments cannot, without undue size requirements for the output buffers.

It will be noted that the time period of one of the segment scan signals SA to SP is many times that of a machine cycle, i.e., a cycle during which one instruction word appearing on the lines 33 is completely executed. Perhaps forty or more machine cycles occur during each of SA, SB, etc. Thus, the output buffer registers 62 and 84, being static or latched, permit the machine to perform various functions during the time that a given segment remains actuated. For example, the digit code D6-D1 of FIG. 2a for the SB period is set up in the registers 83 and 84 during the time SA is actuated. Also, a keyboard test or input routine may be implemented during each of the signals SA to SP.

The concepts of the invention have been described as used in a calculator system. Clearly, these concepts could be used as well in other systems, such as digital watches, or alphanumerical displays or any type.

Although the invention has been described with reference to a specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A method of actuating a display having a plurality of characters by outputting data in a scanned sequence from data memory means which contains data representing a plurality of characters, wherein the display is of the type having a plurality of segments in each character with all like segments in all characters being electrically connected together and each character position of the display having an electrode common to all segments of that character, comprising the steps of repeatedly actuating the segments in a regular sequence, and for actuation of each segment,
   a. comparing in a comparator a representation of the segment currently to be actuated with each of the characters from the data memory means in said scanned sequence, to generate a display signal for each character according to a code when a character contains the segment currently to be actuated,
   b. storing a code corresponding to occurrence of the display signals for the segment currently to be actuated,
   c. and actuating selected ones of said common electrodes according to the stored code.

2. A method according to claim 1 wherein a sequence of signals is generated corresponding to the number of characters to be displayed, in synchronization with comparing said representation with each of said characters from the data memory means.

3. A method according to claim 2 wherein selected ones of said sequence of signals are stored only when coinciding with said display signals, to thereby provide said stored code.

4. A method according to claim 3 including the step of holding said stored code in a buffer register while comparing said representation with the characters from the data memory means.

5. A method according to claim 4 wherein the time period for actuation of each segment in the regular sequence is much longer than the time required to compare said representation with each of the characters from the data memory means.

6. A display actuating system for a display having a plurality of character positions, each character position having a plurality of segments, all like segments in all character positions being electrically connected together and each character position having an electrode common to all segments of that character position, wherein segment scanning means is provided which generates scanning signals to actuate the segments in a regular sequence, the improvement comprising:
   a. a comparator connected to receive a representation of a segment to be actuated and for each segment a scanned sequence of representations of each character to be displayed, and adapted to generate a compare signal when the character to be displayed contains the segment to be actuated,
   b. storage means having a number of bit positions corresponding to the number of character positions to be displayed,
   c. means for addressing the bit positions in said scanned sequence corresponding to the application of the representation of each character to the comparator, and for setting the bit positions in response to the compare signals,
   d. an output buffer means having a number of bit positions corresponding to the number of character positions to be displayed and having inputs to the bit positions connected to the storage means, and
   e. means connecting the output buffer means to said common electrodes of the characters.

7. A system according to claim 6 wherein each character position contains seven number segments arranged in a FIG. "8" and a decimal point segment, and the segments comprise anodes of visible light emitting diodes.

8. A system according to claim 7 wherein the representation of a segment is one-of-eight lines.

9. A system according to claim 6 wherein the characters to be displayed are stored in an addressable memory, and means are provided to address the memory with the same signals used to address the bit positions of the storage means.

* * * * *